(12) United States Patent
Kleven

(10) Patent No.: US 6,531,884 B1
(45) Date of Patent: Mar. 11, 2003

(54) DIAGNOSTICS FOR PIEZOELECTRIC SENSOR

(75) Inventor: Lowell A. Kleven, Eden Prairie, MN (US)

(73) Assignee: Rosemount Inc., Eden Prairie, MN (US)

( * ) Notice: Subject to any disclaimer, the term of this patent is extended or adjusted under 35 U.S.C. 154(b) by 0 days.

(21) Appl. No.: 09/940,329

(22) Filed: Aug. 27, 2001

(51) Int. Cl.$^7$ .............................................. G01R 29/22
(52) U.S. Cl. ...................................... 324/727; 310/319
(58) Field of Search ...................... 73/1.82; 310/318, 310/319; 324/727, 525, 691, 519, 520, 144–157, 160–180, 200–263, 323–377

(56) References Cited

U.S. PATENT DOCUMENTS

| | | | |
|---|---|---|---|
| 3,638,037 A | 1/1972 | McMurtrie | 307/233 |
| 3,709,034 A | 1/1973 | Herzl | 73/194 |
| 3,719,080 A | 3/1973 | Burgess | 73/194 |
| 3,864,972 A | 2/1975 | Burgess et al. | 73/194 |
| 3,872,385 A * | 3/1975 | Koga et al. | 324/727 |
| 4,270,391 A | 6/1981 | Herzl | 73/861.22 |
| 4,467,271 A * | 8/1984 | Ruckenbauer et al. | 324/727 |
| 4,545,258 A | 10/1985 | Coursolle | 73/861.22 |
| 4,815,324 A | 3/1989 | Tada et al. | 73/861.22 |
| 4,866,435 A | 9/1989 | Frick | 340/870.16 |
| 4,893,035 A | 1/1990 | Reynolds et al. | 307/520 |
| 5,022,257 A | 6/1991 | Lew | 73/3 |
| 5,309,711 A | 5/1994 | Lew et al. | 73/861.22 |
| 5,351,556 A | 10/1994 | Lew et al. | 73/861.22 |
| 5,372,046 A | 12/1994 | Kleven et al. | 73/861.22 |
| 5,429,001 A | 7/1995 | Kleven | 73/861.22 |
| 5,435,188 A | 7/1995 | Lew et al. | 73/861.22 |
| 5,517,845 A | 5/1996 | Yamashita et al. | 73/1 |
| 5,587,663 A * | 12/1996 | Roberts et al. | 324/727 |
| 5,942,696 A | 8/1999 | Kleven | 73/861.22 |

FOREIGN PATENT DOCUMENTS

| | | |
|---|---|---|
| DE | 2 028 737 | 1/1971 |
| DE | 198 45 185 A1 | 4/2000 |
| JP | 59018421 | 1/1983 |
| WO | WO 95/06856 | 3/1995 |

OTHER PUBLICATIONS

"Implementation of Digital Signal Processing Techniques in the Design of Thermal Pulse Flowmeters", by Y. Avirav et al., *Transactions on Instrumentation and Measurement*, vol. 39, No. 5, pp. 761–766, Oct. 1990.

* cited by examiner

Primary Examiner—N. Le
Assistant Examiner—Vincent Q. Nguyen
(74) Attorney, Agent, or Firm—Westman, Champlin & Kelly, P.A.

(57) ABSTRACT

A diagnostic device for testing a piezoelectric sensor includes an AC source configured to apply an AC signal to the piezoelectric sensor at two or more different frequencies. The response of the piezoelectric sensor can be measured and used for diagnostics.

24 Claims, 8 Drawing Sheets

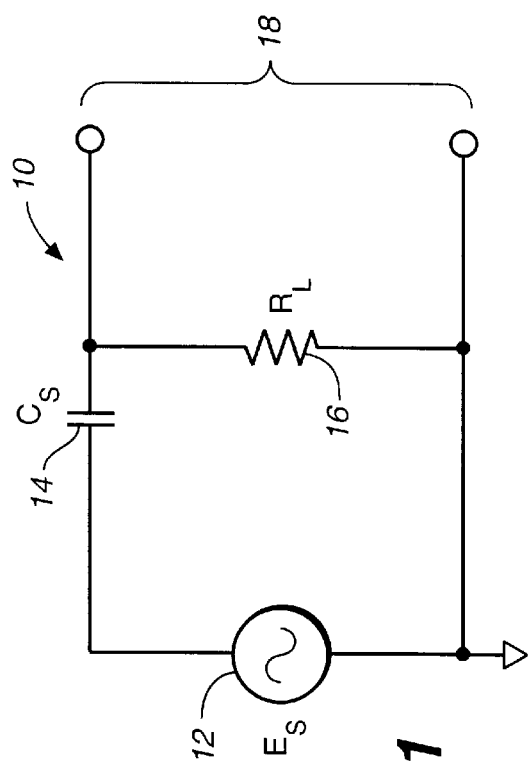
FIG._1
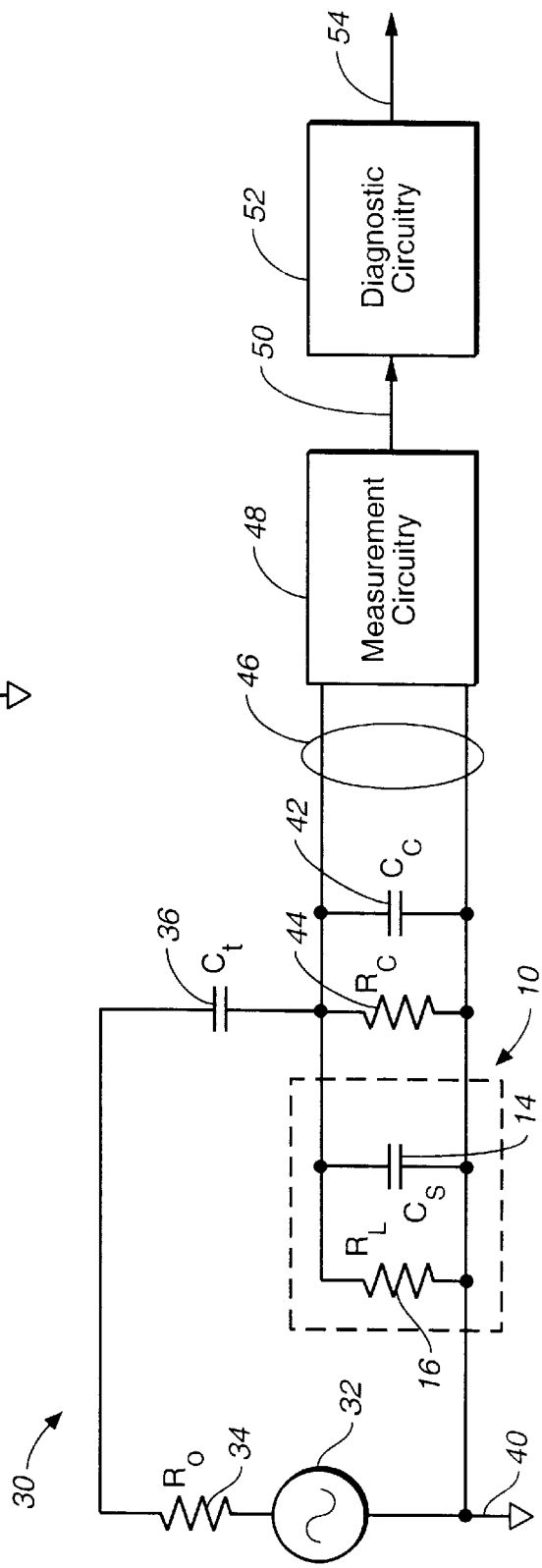
FIG._2

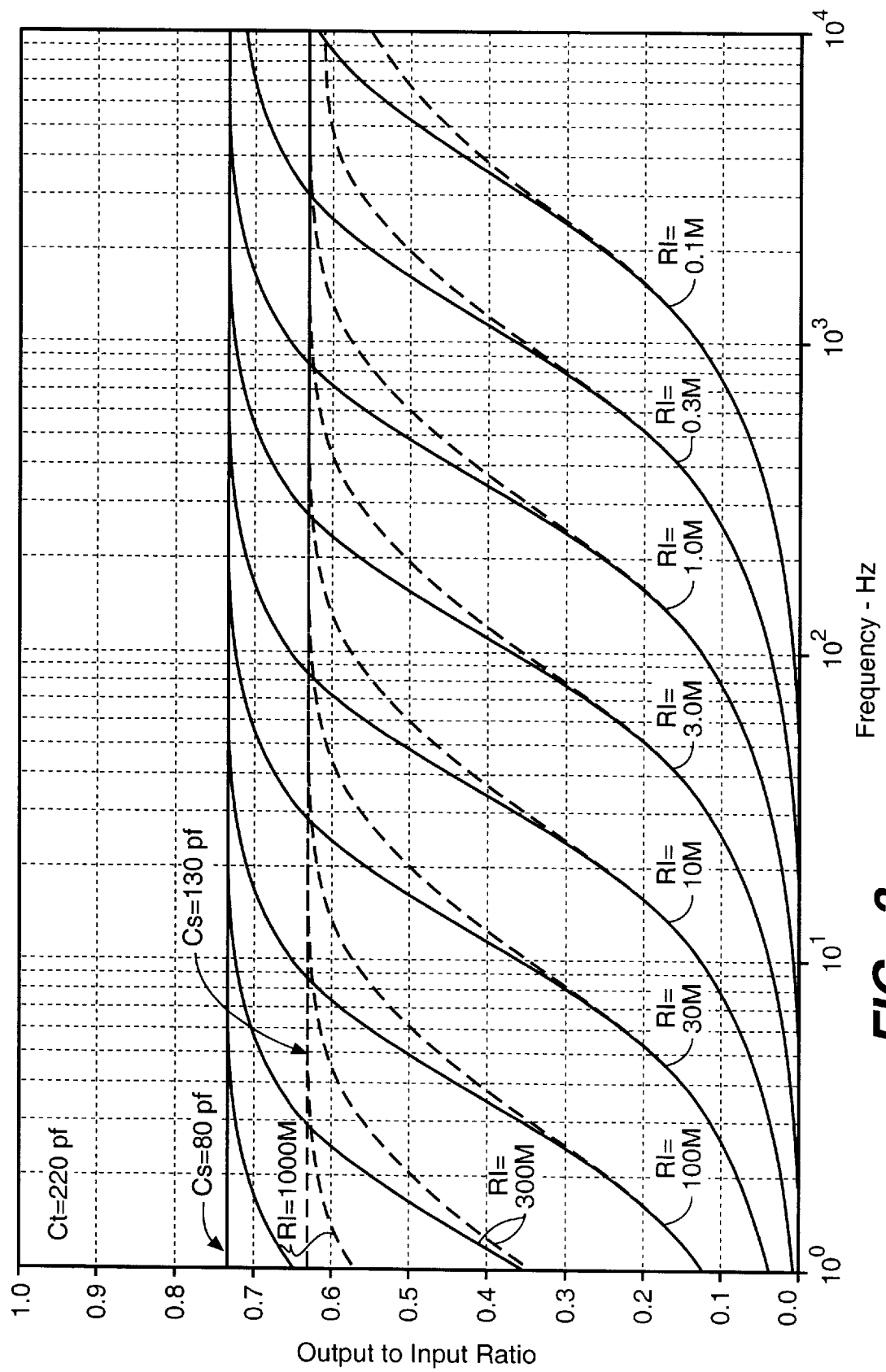
FIG._3

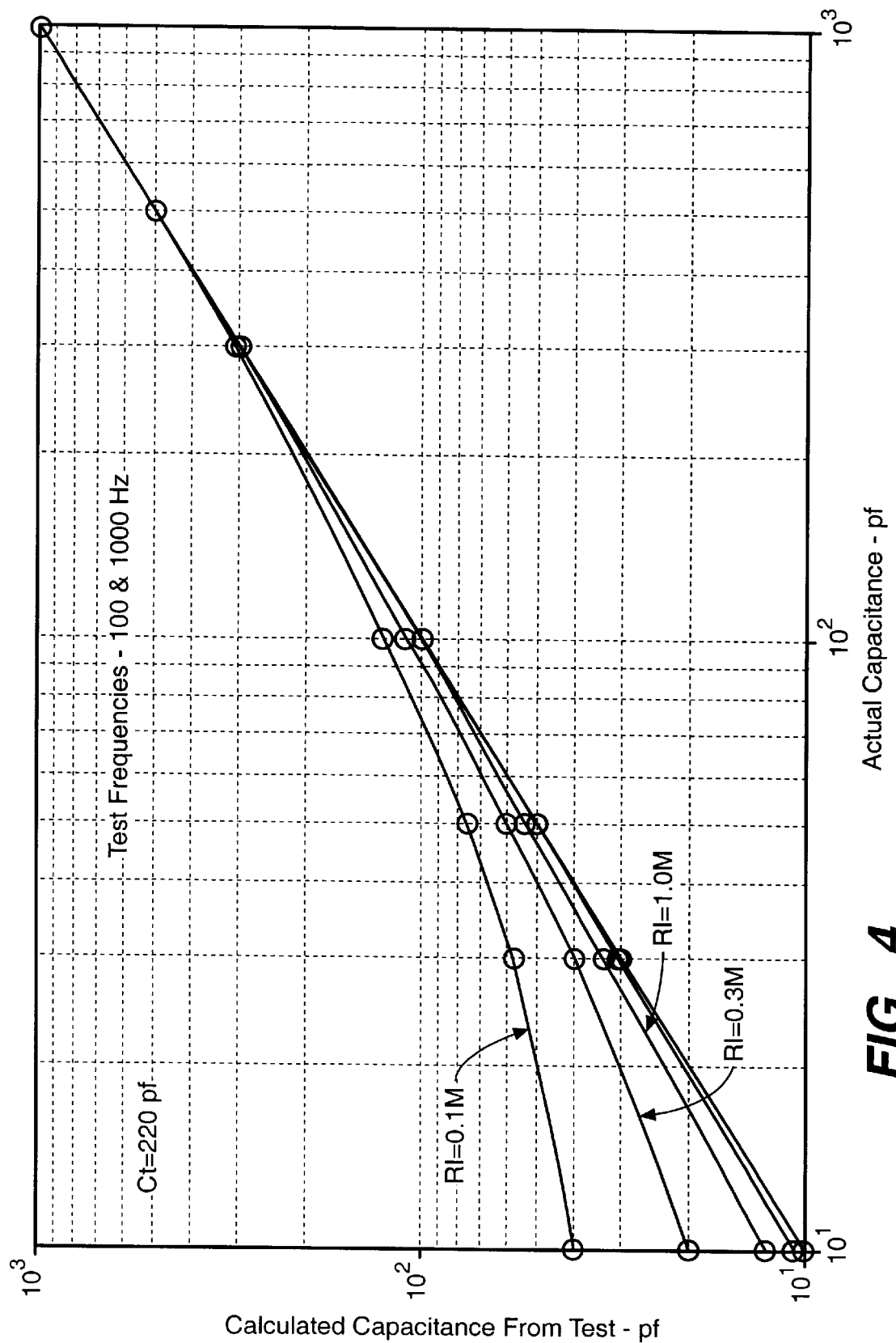
FIG._4

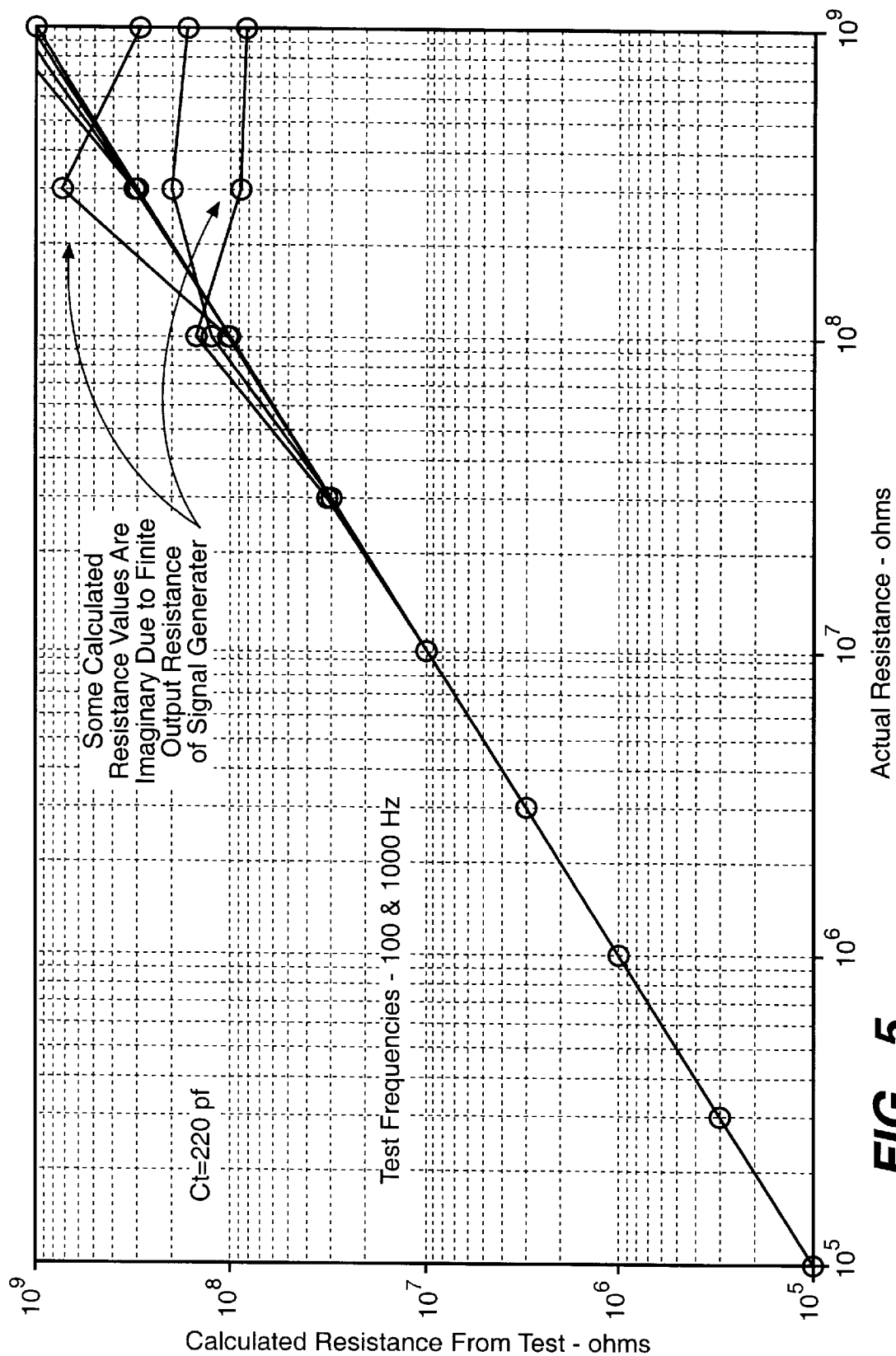
FIG._5

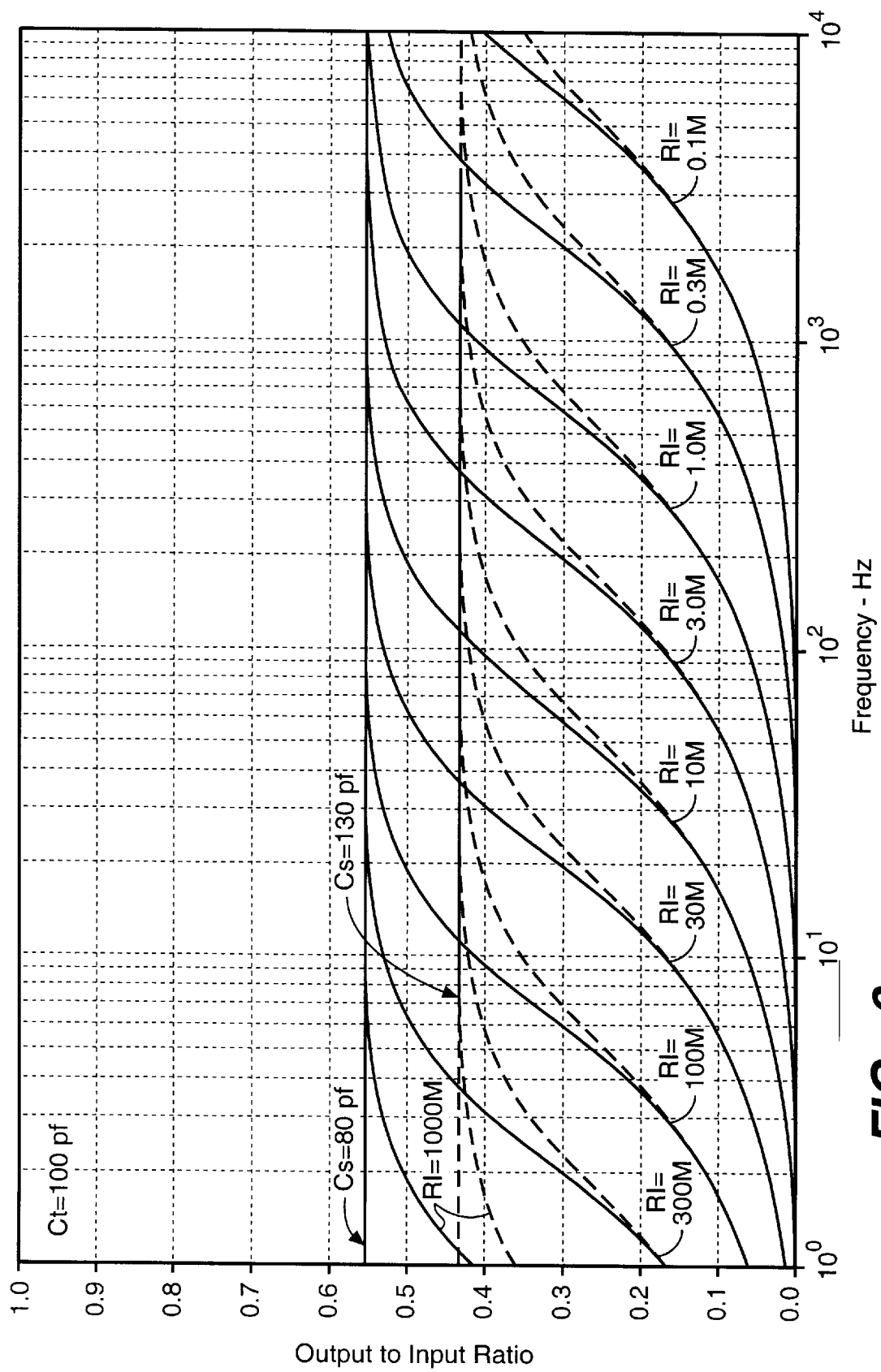
FIG._6

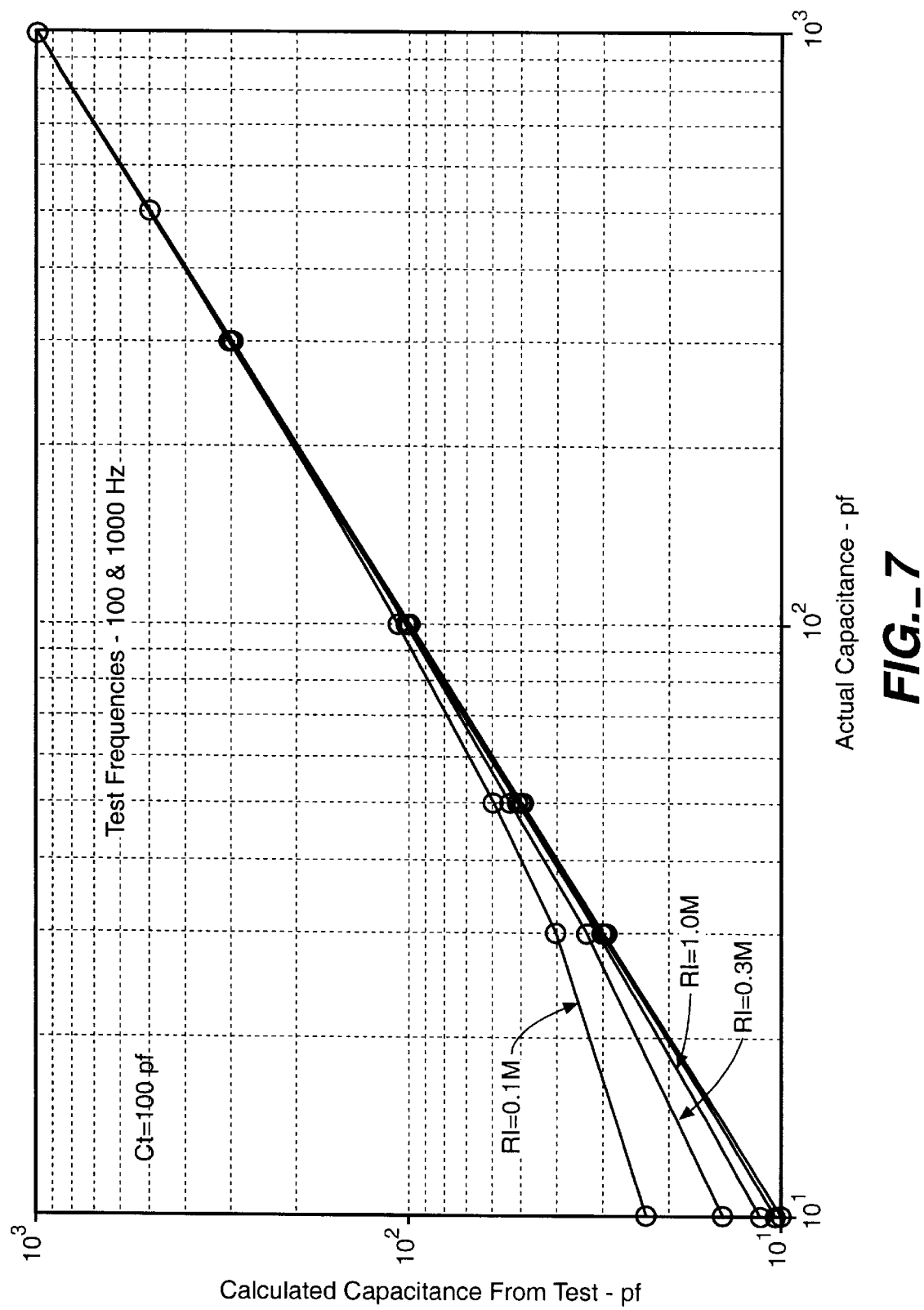
FIG._7

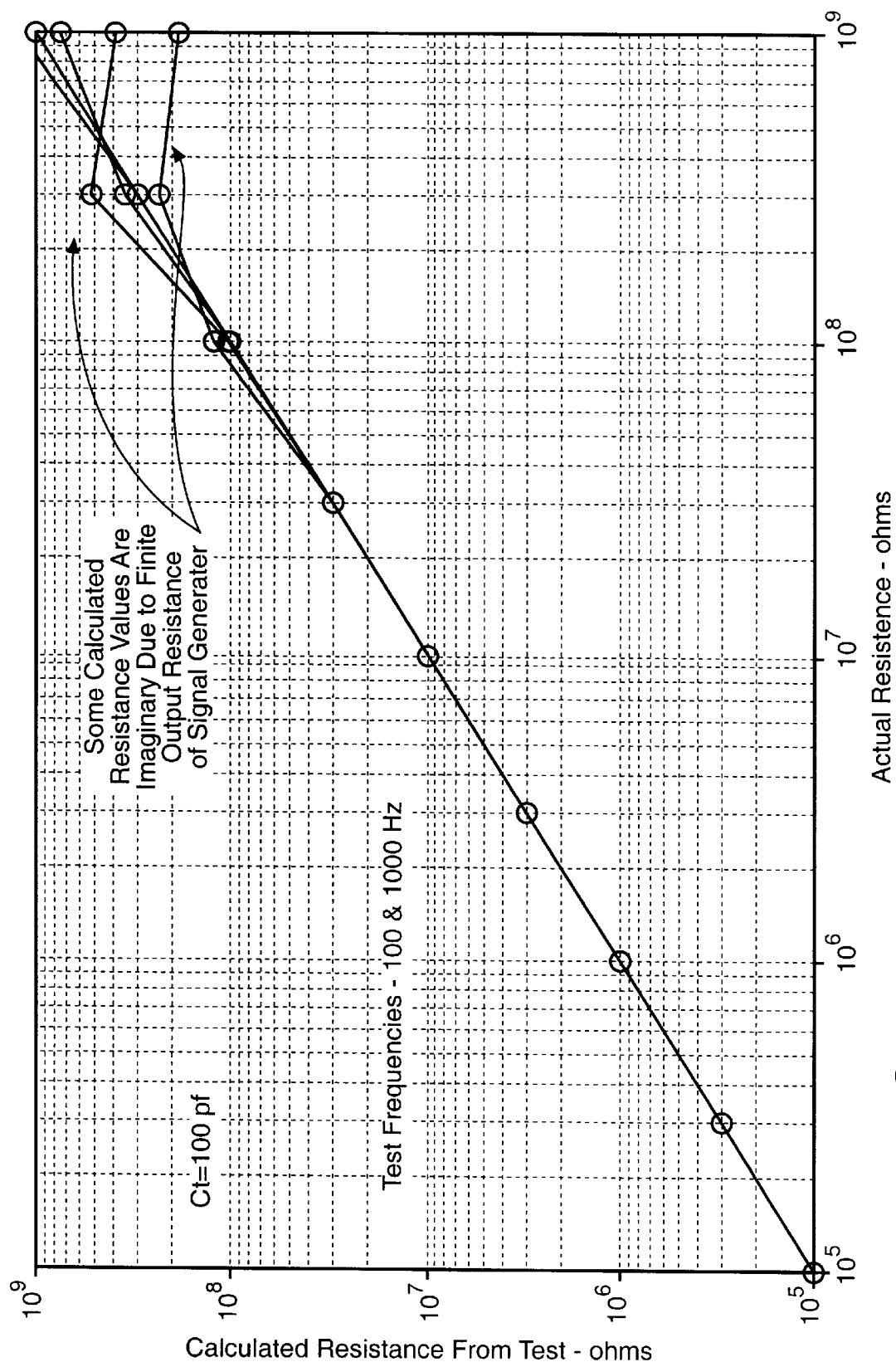
FIG._8

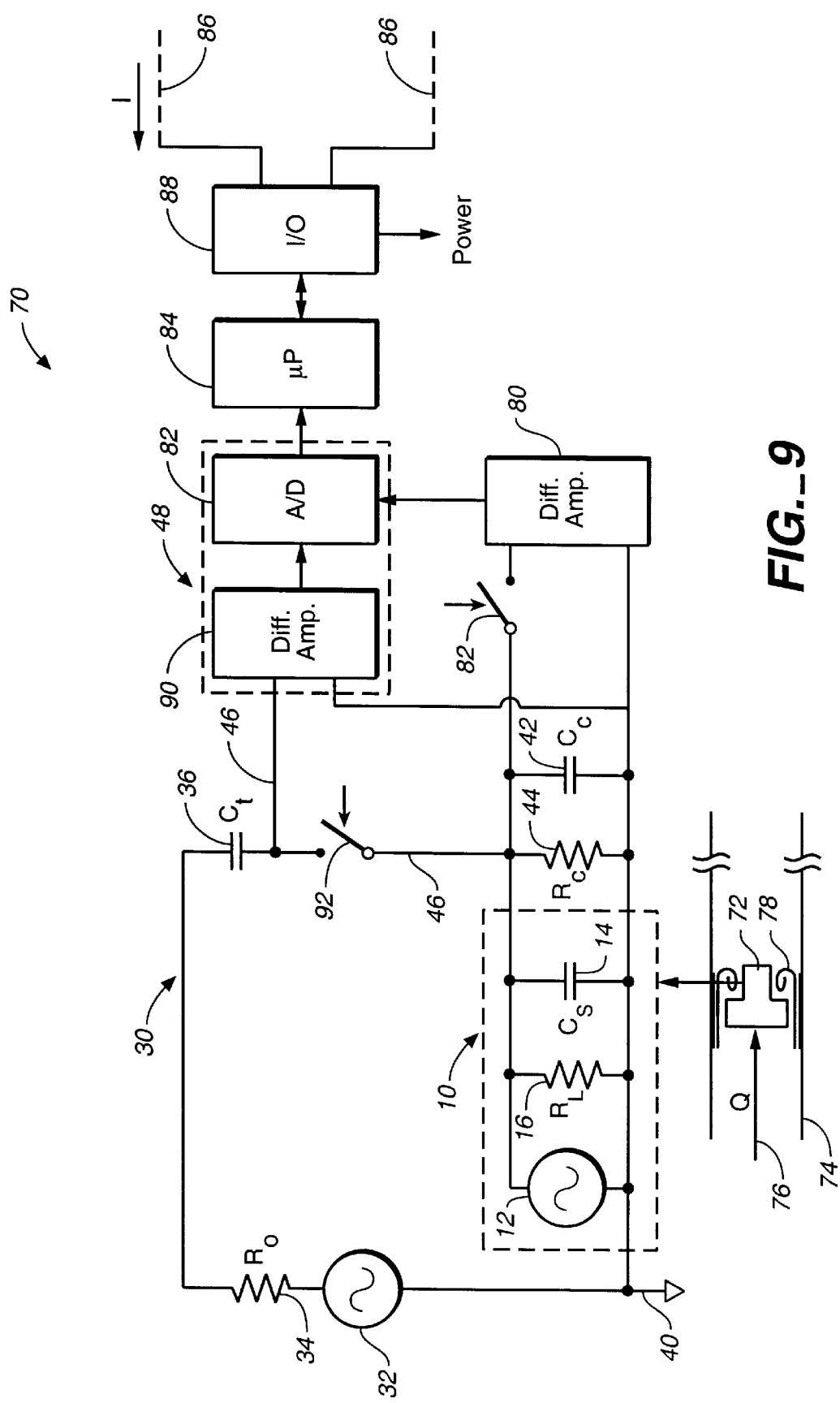
FIG._9

DIAGNOSTICS FOR PIEZOELECTRIC SENSOR

BACKGROUND OF THE INVENTION

The present invention relates to piezoelectric sensors of the type which are used to sense movement or vibration. More specifically, the present invention relates to diagnostics of such piezoelectric sensors.

Piezoelectric sensors are used to sense movement or vibrations in many applications. A piezoelectric sensor comprises a piezoelectric crystal which is typically mechanically coupled to an object which produces a mechanical movement. This causes a mechanical input to the crystal which results in an electrical signal being generated across the crystal. By measuring the electrical signal, it is possible to make determinations regarding the mechanical input which was applied to the crystal.

One application for piezoelectric sensors is in vortex flowmeters. Vortex flowmeters are capable of measuring flow of a gas or fluid (referred to as "process fluid") by monitoring the vibration generated by a bluff body as the fluid flows past the buff body. The piezoelectric sensor is mechanically coupled to the bluff body and generates an electrical output related to the amplitude and frequency of the vibrations in the bluff body. This electrical output can be correlated to the rate at which the gas or fluid is flowing past the bluff body. Such vortex flowmeters are used in industrial processes in which it is desirable to monitor the flow rate of a process fluid.

Failure or degradation of the piezoelectric sensor can cause inaccuracies in measurements obtained from the sensor. If a sensor has wholly or partially failed yet remains in use, the measurements generated from that sensor will be erroneous. In order to ensure that a sensor has not failed it can be necessary to periodically test the sensor. Even in situations where it is clear that the measurements are erroneous, it is still necessary to conduct tests on the sensor and measurement electronics to determine the source of the error. Such testing typically requires that the piezoelectric sensor be taken to a laboratory or placed in some sort of test fixture. This can be time consuming. In industrial process environments in which a vortex flowmeter is located at a remote location, and testing requires temporarily shutting down the process, the testing procedure can be particularly cumbersome.

SUMMARY OF THE INVENTION

A diagnostic device for testing a piezoelectric sensor includes an AC source configured to apply an AC signal to the piezoelectric sensor at two or more different frequencies. Measurement circuitry coupled to the piezoelectric sensor measures a response of the sensor to the applied AC signal and provides a measured output related to a sensor resistance and a sensor capacitance of the piezoelectric sensor. Diagnostic circuitry provides a diagnostic output as a function of the measured output.

BRIEF DESCRIPTION OF THE DRAWINGS

FIG. 1 shows an equivalent circuit for a piezoelectric sensor.

FIG. 2 is a simplified schematic diagram showing test circuitry for use in testing in a piezoelectric sensor.

FIG. 3 is a graph for voltage ratio versus frequency for the circuit of FIG. 2 in which a test capacitance is 220 pf.

FIG. 4 is a graph of calculated capacitance versus actual capacitance for the circuit of FIG. 2 in which a test capacitance is 220 pf.

FIG. 5 is a graph of calculated resistance versus actual resistance for the circuit of FIG. 2 in which a test capacitance is 220 pf.

FIG. 6 is a graph for voltage ratio versus frequency for the circuit of FIG. 2 in which a test capacitance is 100 pf.

FIG. 7 is a graph of calculated capacitance versus actual capacitance for the circuit of FIG. 2 in which a test capacitance is 100 pf.

FIG. 8 is a graph of calculated resistance versus actual resistance for the circuit of FIG. 2 in which a test capacitance is 100 pf.

FIG. 9 is a simplified schematic diagram showing a vortex flowmeter including a piezoelectric sensor and diagnostic circuitry in accordance with the invention.

DETAILED DESCRIPTION OF THE PREFERRED EMBODIMENTS

FIG. 1 is a simplified schematic diagram of the equivalent circuit for a piezoelectric sensor 10. The sensor 10 can be modeled as a voltage source $E_S$ 12 coupled to a series capacitor $C_S$ 14 which is in parallel with a leakage resistance $R_L$ 16. The sensor provides a sensor output 18.

The present invention provides diagnostic information regarding operation of sensor 10 by measuring the capacitance $C_S$ and/or the resistance $R_L$ of the sensor. Typically, a sensor which is in good working order has a very high leakage resistance $R_S$ and a series capacitance $C_S$ which is within normal operating parameters. In one aspect, the present invention applies an AC signal to sensor 10 in order to measure the values of $C_S$ and/or $R_L$.

FIG. 2 shows simplified testing circuitry 30 for use in testing piezoelectric sensor 10 in accordance with one example embodiment of the invention. In FIG. 2, the signal source 12 portion of the equivalent circuit is not illustrated for sensor 10. Circuitry 30 includes a signal generator 32 configured to apply an AC test signal to piezoelectric sensor 10. This signal can be any signal having a time varying component generated from any appropriate source. The output resistance of the signal generator 32 is modeled as a resistance $R_0$ 34. A test capacitance $C_t$ 36 is coupled in series between source 32 and piezoelectric sensor 10. Source 32 and sensor 10 couple to an electrical ground 40. A cable which is used to connect to piezoelectric sensor 10 is modeled as a cable capacitance $C_C$ 42 and a cable leakage-resistance $R_C$ 44. A response signal output 46 is taken across piezoelectric sensor 10 and applied to measurement circuitry 48. Circuitry 48 can comprise isolation amplification, preprocessing, compensation, digitization or other type of circuitry. In some embodiments, measurement circuitry 48 can comprise a direct connection to diagnostic circuitry 52. Diagnostic circuitry 52 receives a measured output signal 50 from circuitry 48 and responsively provides a diagnostic output 54 related to a condition of sensor 10. Circuitry 52 can comprise simple threshold comparison circuitry or more complex circuitry including signal processing circuitry.

In operation, circuitry 30 can provide diagnostic information related to the operation of sensor 10 by applying an AC signal using source 32 and monitoring response signal output 46. For example, if the signal from source 32 is applied at two different frequencies, the values of $R_L$ and $C_S$ can be computed. If the capacitance of sensor 10 is too small, it will appear as an open circuit. Note that the cable capacitance $C_C$ for any cabling can obscure this measurement if the open circuit occurs between the cable and the sensor 10. However, an open circuit can be detected if it occurs between the electronics (not shown in FIG. 2) and the cabling used to connect sensor 10. The leakage resistance $R_L$ appears to be zero for a short circuit and appears as the actual sensor leakage resistance if no shorts exist. Note that the measured resistance is affected by the cabling leakage-resistance $R_C$.

The actual values of the leakage resistance $R_L$ and the sensor capacitance $C_S$ can be determined using mathematical relationships. However, diagnostics can be performed on sensor 10 simply by monitoring the output 46 without requiring the following mathematical formulas be solved. In the following equations the output resistance $R_O$ of signal generator 32 is neglected. This should not provide any significant error if $R_O$ is sufficiently small. The following graphs illustrate that any such errors are only introduced for very low leakage resistances for $C_S$ and high leakage resistance for $R_1$ and $R_C$.

$C_S$ can be determined using Equation 1 and $1/R_L$ using Equation 2 as follows:

$$c_s = c_t \left[ \sqrt{\frac{1 - \omega_2^2/\omega_1^2 \cdot er_1^2/er_2^2}{1 - \omega_2^2/\omega_1^2}} [1/er_1] - 1 \right] \quad \text{EQ. 1}$$

$$1/R_L = \omega_2 \cdot Ct/er_1 \sqrt{\frac{er_1^2/er_2^2 - 1}{1 - \omega_2^2/\omega_1^2}} \quad \text{EQ. 2}$$

where $\omega_1$ and $\omega_2$ are the frequencies of two different signals from signal generator 32 and $er_1$ and $er_2$ are the ratios of the output voltage at output 46 to the input voltage across the signal generator 32 at the respective two test frequencies.

FIG. 3 is a graph which shows output to input ratio (er) versus frequency for various values of $C_S$ and $R_L$ where $C_t$ is 220 pf. FIGS. 4 and 5 are graphs which show the calculated capacitance and calculated resistance, respectively, versus actual capacitance for various values of $R_L$ where the two test frequencies are 100 and 1000 Hz. FIGS. 6, 7 and 8 are graphs similar to FIGS. 3, 4 and 5, respectively, except that a test capacitance of 100 pf is used. From these graphs it can be seen that errors in the calculated values are slightly less when a lower test capacitor value is used.

In the graphs shown in FIGS. 3–8, the signal generator output resistance $R_O$ is included (having a maximum value, of for example, 13,800 ohms). For some types of signal generators, this resistance is variable depending on the output voltage level. When the resistance is zero the above equations are exact.

FIG. 9 is a simplified block diagram showing a vortex flowmeter 70 of the type used in a process control or monitoring system. Vortex flowmeter 70 includes piezoelectric sensor 10 mechanically coupled to a bluff body 72. Bluff body 72 is placed in a pipe or conduit 74. A flow 76 (Q) of process fluid past bluff body 72 causes vortexes 78 to be formed adjacent the bluff body 72. This induces a vibration in bluff body 72 which is transferred to piezoelectric sensor 10. Sensor 10 responsively creates an electrical signal as discussed above. This signal is amplified by differential amplifier 80 which couples to sensor 10 through switch 82. The output from the differential amplifier 80 is digitized by analog to digital converter 82 and provided to a microprocessor 84. Using known equations, microprocessor 84 can calculate the flow rate based upon the digitized signal. Microprocessor 84 communicates over a process control loop such as two-wire control loop 86 through input/output circuitry 88. In some embodiment, input/output circuitry 88 can include power supply circuitry which is used to power all of the electronics of vortex flowmeter 70 from power received through loop 86. Loop 86 carries information related to the calculated flow such as, for example, a current I which varies in accordance with a predetermined relationship to the measured flow or a digital signal.

In accordance with the present invention, vortex flowmeter 70 includes circuitry 30 for testing and performing diagnostics on sensor 10. In the example of FIG. 9, measurement circuitry 48 is formed by a differential amplifier 90 and analog to digital converter 82. Microprocessor 84 is an example implantation of diagnostic circuitry. In operation, microprocessor 84 operates switch 82 to obtain flowrate measurements. In order to perform diagnostics, microprocessor 84 opens switch 82 and closes switch 92. Differential amplifier 90 is then configured to sense the response signal generated by sensor 10 in response to source 32. In some embodiments, source 32 can be an AC signal of source from other circuitry such as circuitry used in analog to digital converters, etc. The amplified signal is digitized by analog to digital converter 82 and provided to microprocessor 84.

Microprocessor 84 can analyze the measured output signal from the analog to digital converter 82. For example, the amplitudes of the response signal 46 taken when source 32 is at two or more different frequencies can be compared to threshold values. To provide more accurate diagnostic measurements, it can also be desirable to measure the AC signal from source 32. Additionally, more complex analysis can be performed to obtain more detailed information regarding sensor 10 and specifically information related to the values for $R_L$ and $C_S$ in sensor 10. Once the diagnostics operation is complete, microprocessor 84 opens switch 92 and closes switch 82 such that flowmeter 70 can return to normal operation.

Based upon the results of the diagnostics, microprocessor 84 can communicate information over loop 86, or through other means, and can inform an operator that sensor 10 is in the process of failing or has already failed. Based upon the severity of the degradation of sensor 10, in some instances it may be desirable for microprocessor 84 to compensate flow measurements based upon the diagnostic results. For example, if the sensor 10 fails in a predictable manner, a compensation curve can be used to compensate for errors in the sensor output or flow calculation.

Diagnostics can be initiated periodically by microprocessor 84 based upon predetermined conditions such as during prescheduled down times or constant flow periods. Microprocessor 84 can also receive commands to perform diagnostics through input/output circuitry 88. The communication can be provided through (not shown) input/output circuitry which is used to communicate with a local device or with service personnel.

Although the present invention has been described with reference to preferred embodiments, workers skilled in the art will recognize that changes may be made in form and detail without departing from the spirit and scope of the invent-ion. Any appropriate AC signal or technique for applying to AC signal can be used. Similarly, any appropriate technique can be used to sense and process the response signal. Diagnostics can be through any appropriate technique including threshold or frequency detection techniques or through more advanced signal processing techniques. The various circuit components can be implemented in analog or digital form, or their combination. For example, the diagnostic circuitry can be analog threshold comparison circuitry.

What is claimed is:

1. A diagnostic device for testing a piezoelectric sensor, comprising:
   an AC source configured to apply an AC signal to the piezoelectric sensor at at least two different frequencies;
   measurement circuitry coupled to the piezoelectric sensor configured to measure a response of the sensor to the applied AC signal and responsively provide a measured output capacitance of the piezoelectric sensor; and
   diagnostic circuitry having a diagnostic output as a function of the measured output.

2. The diagnostic device of claim 1 wherein the measured output is related to a sensor resistance and a sensor.

3. The diagnostic device of claim 1 wherein the AC signal is applied at two frequencies.

4. The diagnostic device of claim 1 including a test capacitance coupled to the AC source and the piezoelectric sensor.

5. The diagnostic device of claim 1 including a switch to selectively couple the diagnostic circuitry to the piezoelectric sensor.

6. The diagnostic device of claim 1 wherein the measurement circuitry includes an amplifier configured to amplify the response of the sensor.

7. The diagnostic device of claim 1 wherein the diagnostic circuitry comprises threshold comparison circuitry.

8. The diagnostic device of claim 1 wherein the measurement circuitry includes an analog to digital converter configured to digitize the response of the sensor.

9. The diagnostic device of claim 8 wherein the diagnostic circuitry comprises a microprocessor coupled to the analog to digital converter.

10. The diagnostic device of claim 9 wherein the microprocessor provides the diagnostic output as a function of a comparison of the digitized response signal to a threshold.

11. The diagnostic device of claim 9 wherein the microprocessor provides the diagnostic output as a function of digital signal processing performed on the digitized output.

12. A vortex flowmeter having a piezoelectric sensor coupled to a bluff body and including the diagnostic device of claim 1.

13. The vortex flowmeter of claim 12 including input/output circuitry coupled to a two-wire process control loop.

14. The vortex flowmeter of claim 13 wherein all circuitry in the vortex flowmeter is completely powered with power received from the process control loop.

15. A method of diagnosing a piezoelectric sensor, comprising:
   applying an AC signal at at least two different frequencies to the piezoelectric sensor;
   measuring a response signal from the piezoelectric sensor generated in response to the applied AC signal; and
   diagnosing a condition of the piezoelectric sensor as a function of the measured output.

16. The method of claim 15 wherein applying an AC signal comprises applying an AC signal at only two frequencies.

17. The method of claim 15 wherein applying an AC signal comprises applying different frequencies sequentially.

18. The method of claim 15 wherein measuring a response signal comprises amplifying the response signal.

19. The method of claim 15 wherein measuring the response signal comprises digitizing the response signal.

20. The method of claim 15 wherein diagnosing a condition comprises comparing the response signal to a threshold.

21. The method of claim 15 including disconnecting the piezoelectric sensor from the circuitry prior to applying the AC signal.

22. A diagnostic device configured to implement the method of claim 15.

23. A vortex flowmeter including diagnostics for testing a piezoelectric sensor, comprising:
   a bluff body coupled to a piezoelectric sensor;
   an AC source configured to apply an AC signal to the piezoelectric sensor at least two different frequencies;
   measurement circuitry coupled to the piezoelectric sensor configured to measure a response of the sensor to the applied AC signal and responsively provide a measured output capacitance of the piezoelectric sensor; and
   diagnostic circuitry having a diagnostic output as a function of the measured output.

24. A diagnostic device for testing a piezoelectric sensor, comprising:
   AC source means for applying an AC signal to the piezoelectric sensor at at least two different frequencies;
   measurement means coupled to the piezoelectric sensor for measuring a response of the sensor to the applied AC signal and for providing a measured output related to a sensor resistance and a sensor capacitance of the piezoelectric sensor; and
   diagnostic means for diagnosing the piezoelectric sensor as a function of the measured output.

* * * * *